United States Patent
Kim et al.

[11] Patent Number: 5,848,315
[45] Date of Patent: Dec. 8, 1998

[54] DEVELOPMENT MONITORING APPARATUS AND METHOD ADOPTING THE SAME

[75] Inventors: Yeong-seon Kim; Min-gyu Ko, both of Suwon; Hoe-sik Chung, Seongnam; Hong Lee, Seoul, all of Rep. of Korea

[73] Assignee: Samsung Electronics Co., Ltd., Suwon, Rep. of Korea

[21] Appl. No.: 747,512

[22] Filed: Nov. 12, 1996

[30] Foreign Application Priority Data

Nov. 11, 1995 [KR] Rep. of Korea .................. 1995 40860

[51] Int. Cl.⁶ ........................................ G03D 13/00
[52] U.S. Cl. ..................... 396/567; 396/611; 156/626.1
[58] Field of Search .................... 396/604, 611, 396/627, 567, 568; 156/345, 346, 347, 626.1, 643; 430/5, 30; 437/228, 923, 8

[56] References Cited

U.S. PATENT DOCUMENTS

| | | | |
|---|---|---|---|
| 4,136,940 | 1/1979 | Lin ........................................... | 396/611 |
| 4,569,717 | 2/1986 | Ohgami et al. ......................... | 156/626 |
| 5,190,614 | 3/1993 | Leach et al. ............................. | 156/626 |
| 5,271,796 | 12/1993 | Miyashita et al. ...................... | 156/626 |
| 5,272,116 | 12/1993 | Hosono .................................... | 437/228 |
| 5,413,941 | 5/1995 | Koos et al. ................................ | 437/8 |
| 5,516,608 | 5/1996 | Hobbs et al. ............................. | 430/30 |
| 5,591,300 | 1/1997 | Schiller ................................. | 156/626.1 |

*Primary Examiner*—D. Rutledge
*Attorney, Agent, or Firm*—Jones & Volentine, L.L.P.

[57] ABSTRACT

A development monitoring apparatus in which a non-exposed wafer is easily reworked by monitoring a developed portion and an undeveloped portion of a photoresist film on a wafer. The apparatus includes a light source for outputting incident light to a wafer having a photoresist film coated with a developer, and a light collector for collecting reflected light reflecting from the wafer. A filter transmits only the reflected light having a desired wavelength. A photoelectric device transforms the reflected light which passes through the filter into an electrical signal. Correct development of the photoresist film is determined by measuring the intensity change of the electrical signal over time. Accordingly, an exposed wafer and an non-exposed wafer are rapidly reworked, so that an increase in manufacturing costs and deterioration of yield rate can be prevented.

5 Claims, 3 Drawing Sheets

DEVELOPMENT MONITORING APPARATUS AND METHOD ADOPTING THE SAME

BACKGROUND OF THE INVENTION

1. Field of the Invention

The present invention relates to a development monitoring apparatus in a photolithography process used for a semiconductor device and a method adopting the same, and more particularly, to a development monitoring apparatus where the wafer is easily reworked by monitoring a developed portion and an undeveloped portion of a photoresist film, and to a method adopting the same.

2. Description of the Related Arts

In general, various patterns of a semiconductor device are formed by sequentially performing a photolithography process and an etching process. In forming a pattern by the photolithography and etching processes, a photoresist film (where the solubility is changed by irradiation of light such as an x-ray or an ultraviolet ray) is formed on a film such as an insulating film or a conductive film on a semiconductor wafer, where a pattern is to be formed. A predetermined portion of the photoresist film is exposed, and then a portion having high solubility with respect to a developer is eliminated, thereby forming a photoresist pattern. Then, a film exposed by the photoresist pattern is etched to form various patterns such as wiring layers and electrodes.

The photolithography process has been performed by developing approximately 25 to 50 wafers at a time, and then manually examining a selected part of the total wafers in order to determine whether or not the wafers are exposed. Accordingly, it is impossible to efficiently determine whether or not the exposure was correctly performed to specifications. Also, when a film where a pattern is to be formed is etched using a photoresist pattern in which the mask is underdeveloped or undeveloped, the yield rate is greatly deteriorated.

In addition, when the developing process is performed on all wafers, including non-exposed wafers, there is a loss of time and manufacturing costs increase.

SUMMARY OF THE INVENTION

Accordingly, it is an object of the present invention to provide a development monitoring apparatus where the wafer can be easily reworked by monitoring a developed portion and an undeveloped portion.

It is another object of the present invention to provide a development monitoring method adopting the apparatus.

To accomplish these and other objects, the present invention provides a development monitoring apparatus comprising: a light source for outputting incident light to a wafer having a photoresist film coated with a developer; an optical sensor for sensing reflected light reflecting from the wafer; a filter for transmitting only the reflected light having a desired wavelength; a photoelectric device for transforming the reflected light which passes through the filter into an electrical signal; and an output portion for outputting the electrical signal, wherein correct development of the photoresist film is determined by measuring an intensity change of the electrical signal over time.

It is preferable that said photoelectric device comprises a diode.

In another aspect, there is provided a development monitoring method comprising the steps of: a) forming a photoresist film on a wafer; b) coating the photoresist film with a developer; c) inputting incident light on the wafer; d) filtering reflected light having a desired wavelength among the reflected light reflecting from the wafer; e) transforming the filtered reflected light into an electrical signal; and f) measuring an intensity variation of the electric signal over time for determining whether or not the photoresist film is correctly developed.

It is preferable that the transforming step be performed by using a photoelectric device. It is also preferable that the filtering step be performed by using a filter.

Accordingly, an exposed wafer and a non-exposed wafer are rapidly reworked, so that increases in the manufacturing cost and deterioration of yield rate can be prevented.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PRESENT INVENTION

Figure 1:
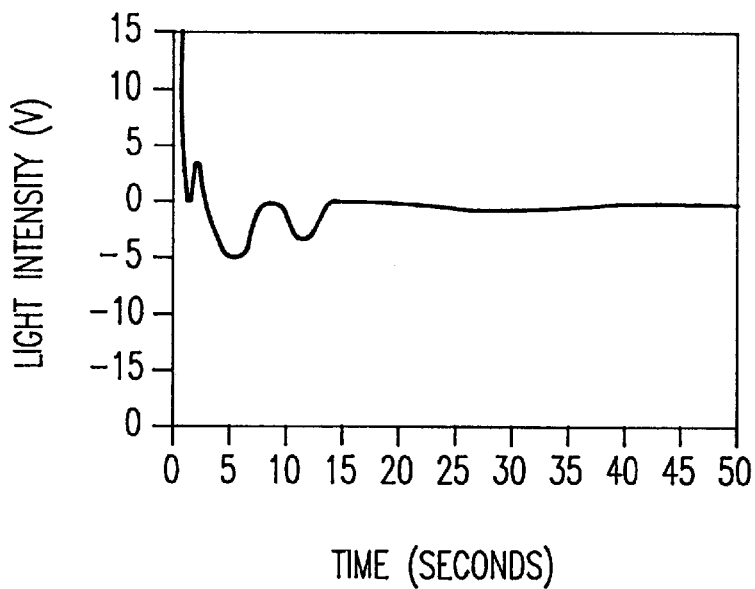
FIGS. 1 and 2 are graphical views for illustrating the principle of a development monitoring apparatus according to the present invention.
Figure 2:
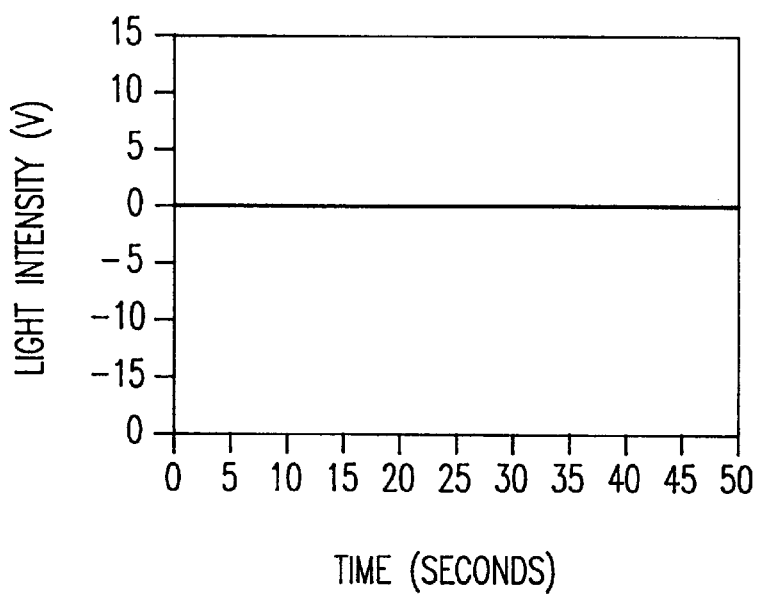

Referring to FIGS. 1 and 2, the light intensity over time for an exposure portion and a non-exposure portion of a photoresist film are respectively shown. The Y-axis in FIGS. 1 and 2 indicates the light intensity value transformed into an electrical signal. The developing rate, i.e. an etching rate, of the exposed photoresist film is hundreds of times higher than that of the non-exposed photoresist film. Accordingly, when light is irradiated vertically to a surface of a wafer which is coated with the photoresist film, constructive interference and destructive interference occur between incident light and reflected light.

The thickness of the exposed photoresist film is rapidly reduced in a developer over time, so that the light intensity also changes over time due to a path difference of reflected light as shown in FIG. 1. The thickness of non-exposed photoresist film is hardly changed over time, so that the light intensity of the reflected light is not changed over time as shown in FIG. 2. Accordingly, the electrical signal, which the intensity change of the reflected light is transformed into, is measured so that an exposed portion of a wafer and non-exposed portion thereof can be sensed and identified.

Figure 3:
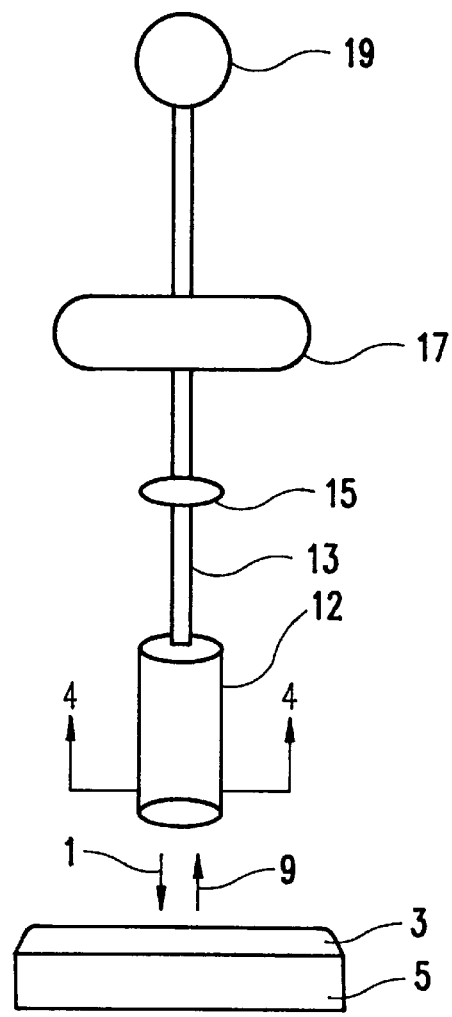
FIG. 3 is a schematic view showing a development monitoring apparatus according to the present invention.
Figure 4:
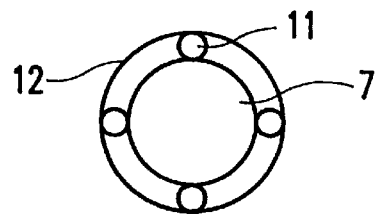
FIG. 4 is a horizontal sectional view of a portion of the assembly in FIG. 3 taken along the line 4—4.

Referring to FIG. 3 and FIG. 4, a development monitoring apparatus according to the present invention includes a light source 7 for outputting the incident light 1 to a wafer 5 coated with a photoresist film (not shown) and a developer 3. A light collector 11 collects or gathers the reflected light 9 reflecting from the wafer 5. An optical fiber 13 carries all the reflected light from the light collector 11 without loss. The filter 15 transmits only the light having a desired wavelength, and an optical sensor 17 transforms the light, which passes through the filter 15, into an electrical signal. In a preferred embodiment, the optical sensor is a photoelectric device. In another embodiment, the photoelectric device comprises a diode. An output portion 19 outputs the electrical signals. Reference numeral 12 indicates an assembly housing the light source 7 and the light collector 11.

Due to a second reflection by a film under the photoresist film, the wavelengths of the reflected light have variations according to the layer structure. This is the reason why the filter 15 is needed. For example, for light having a wavelength of 740 nm, a filter that only passes the wavelength of 740 nm is used. The outputting portion 19 can easily determine and identify correct exposure or non-exposure of a wafer by an alarm or other signal when a certain electrical signal is output, thereby allowing further rework of the non-exposed wafer.

Figure 5:
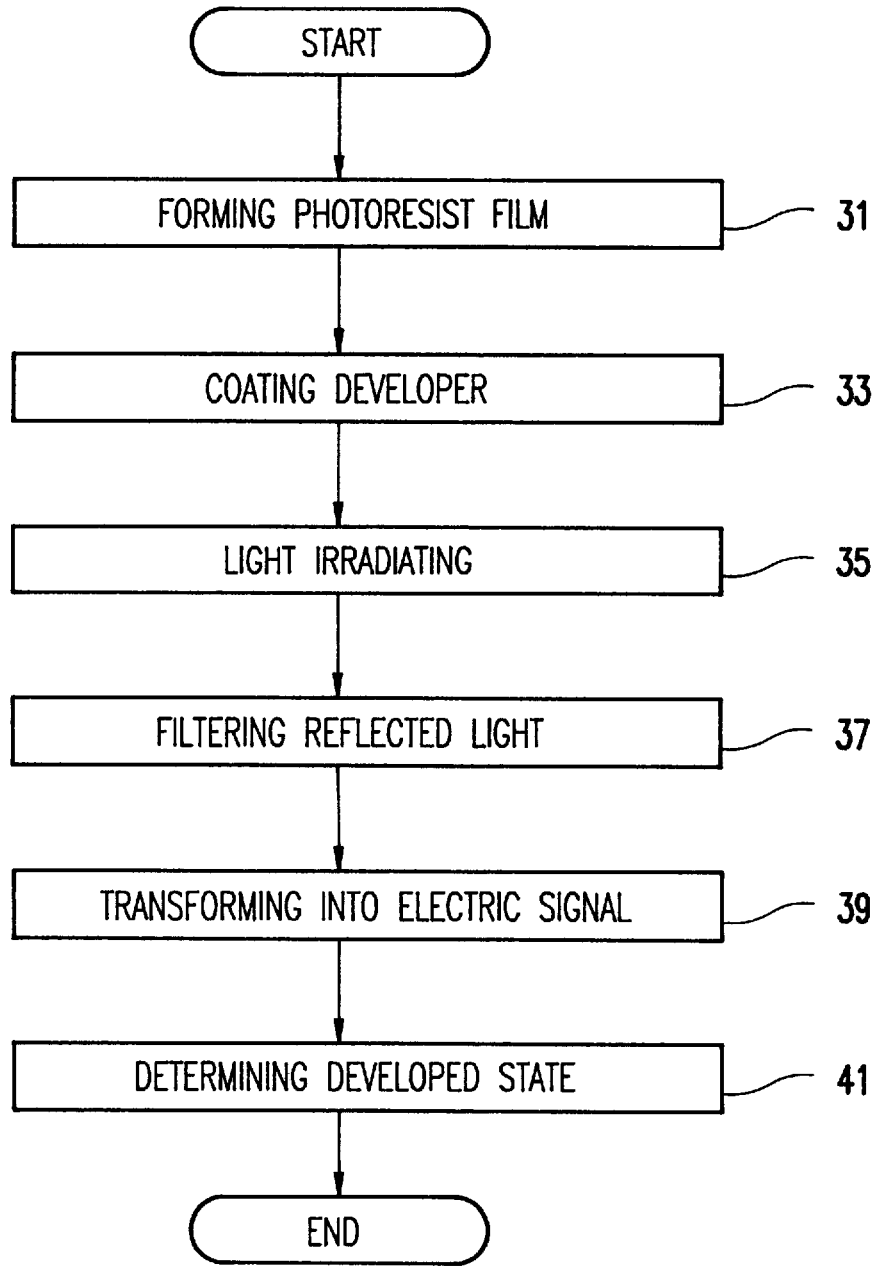
FIG. 5 is a flowchart showing a method for development monitoring according to the present invention.

FIG. 5 is a flowchart showing a method for development monitoring according to the present invention. In the development monitoring method of the present invention, a photoresist film is formed on a wafer in step 31. Next, a developer is coated on the photoresist film in step 33. Then, the wafer coated with the developer is irradiated by a light source such as laser or halogen lamp in step 35.

The light reflected from the wafer is filtered in step 37 to form a filtered reflected light having a desired wavelength. The filtered reflected light is transformed into electrical signals in step 39 by using the photoelectric device. Finally, in step 41, the intensity variations of the transformed electrical signals are measured over time, to thereby determine whether or not the photoresist film is developed.

According to the present invention, in a developing process, non-exposed wafers can be easily and rapidly distinguished from exposed wafers by a worker, and an undeveloped wafer due to the non-exposure can be reworked. Accordingly, an increase in the cost of manufacturing a semiconductor device and deterioration of yield rate can be prevented.

It should be understood that the invention is not limited to the illustrated embodiment and that many changes and modifications can be made within the scope of the invention by a skilled person in the art.

What is claimed is:

1. A photoresist development monitoring apparatus comprising;
   - a light source for outputting incident light to a wafer that is coated with a photoresist film, which film is coated with a developer;
   - a light collector for collecting reflected light reflecting from said wafer;
   - a wavelength filter for transmitting only reflected light having a desired wavelength;
   - an optical fiber disposed between said light collector and said wavelength filter for carrying the reflected light from the light collector to the wavelength filter;
   - an optical sensor for transforming the reflected light which passes through said wavelength filter into an electrical signal; and
   - an output portion for outputting the electrical signal, wherein correct development of said photoresist film is determined by measuring an intensity change of said electrical signal over time.

2. A development monitoring apparatus according to claim 1, wherein said optical sensor comprises a photoelectric device.

3. The apparatus of claim 1, wherein said light source is a halogen lamp.

4. The apparatus of claim 1, wherein said light source is a laser.

5. The apparatus of claim 2, wherein said photoelectric device comprises a diode.

\* \* \* \* \*